(12) United States Patent
Kavukcuoglu et al.

(10) Patent No.: US 11,948,075 B2
(45) Date of Patent: Apr. 2, 2024

(54) GENERATING DISCRETE LATENT REPRESENTATIONS OF INPUT DATA ITEMS

(71) Applicant: DEEPMIND TECHNOLOGIES LIMITED, London (GB)

(72) Inventors: Koray Kavukcuoglu, London (GB); Aaron Gerard Antonius van den Oord, London (GB); Oriol Vinyals, London (GB)

(73) Assignee: DeepMind Technologies Limited, London (GB)

( * ) Notice: Subject to any disclaimer, the term of this patent is extended or adjusted under 35 U.S.C. 154(b) by 1149 days.

(21) Appl. No.: 16/620,815

(22) PCT Filed: Jun. 11, 2018

(86) PCT No.: PCT/EP2018/065308
§ 371 (c)(1),
(2) Date: Dec. 9, 2019

(87) PCT Pub. No.: WO2018/224690
PCT Pub. Date: Dec. 13, 2018

(65) Prior Publication Data
US 2020/0184316 A1    Jun. 11, 2020

Related U.S. Application Data

(60) Provisional application No. 62/517,824, filed on Jun. 9, 2017.

(51) Int. Cl.
*G06N 3/08* (2023.01)
*G06N 3/04* (2023.01)

(52) U.S. Cl.
CPC ............... *G06N 3/08* (2013.01); *G06N 3/04* (2013.01)

(58) Field of Classification Search
CPC .......................................................... G06N 3/08
See application file for complete search history.

(56) References Cited

U.S. PATENT DOCUMENTS

| 7,400,588 | B2 * | 7/2008 | Izzat | ............ | H04L 47/10 |
| | | | | | 370/465 |
| 2016/0098633 | A1 * | 4/2016 | Min | ............ | G06N 3/08 |
| | | | | | 706/25 |

(Continued)

OTHER PUBLICATIONS

Chung et al., "A Recurrent Latent Variable Model for Sequential Data", 2016 (Year: 2016).*

(Continued)

*Primary Examiner* — Selene A. Haedi
(74) *Attorney, Agent, or Firm* — Fish & Richardson P.C.

(57) ABSTRACT

Methods, systems, and apparatus, including computer programs encoded on computer storage media, for generating discrete latent representations of input data items. One of the methods includes receiving an input data item; providing the input data item as input to an encoder neural network to obtain an encoder output for the input data item; and generating a discrete latent representation of the input data item from the encoder output, comprising: for each of the latent variables, determining, from a set of latent embedding vectors in the memory, a latent embedding vector that is nearest to the encoded vector for the latent variable.

20 Claims, 5 Drawing Sheets

(56) References Cited

U.S. PATENT DOCUMENTS

| | | | | |
|---|---|---|---|---|
| 2018/0247200 | A1* | 8/2018 | Rolfe | G06N 3/045 |
| 2018/0249158 | A1* | 8/2018 | Huang | G06N 3/04 |

OTHER PUBLICATIONS

Serban et al., "A Hierarchical Latent Variable Encoder-Decoder Model for Generating Dialogues", Feb. 2017 (Year: 2017).*
Shu et al., "Neural Face Editing with Intrinsic Image Disentangling", Apr. 2017 (Year: 2017).*
Agustsson et al., "Soft-to-Hard Vector Quantization for End-toEnd Learned Compression of Images and Neural Networks," https://arxiv.org/abs/1704.00648v1, Apr. 2017, 15 pages.
Beattie et al., "DeepMind Lab," https://arxiv.org/abs/1612.03801v2, Dec. 2016, 11 pages.
Bengio et al., "Estimating or Propagating Gradients Through Stochastic Neurons for Conditional Computation," https://arxiv.org/abs/1308.3432, Aug. 2013, 12 pages.
Bowman et al., "Generating Sentences from a Continuous Space," https://arxiv.org/abs/1511.06349v1, Nov. 2015, 13 pages.
Burda et al., "Importance Weighted Autoencoders," https://arxiv.org/abs/1509.00519v1, Sep. 2015, 12 pages.
Chen et al., "InfoGAN: Interpretable Representation Learning by Information Maximizing Generative Adversarial Nets," https://arxiv.org/abs/1606.03657, Jun. 2016, 14 pages.
Chen et al., "Variational Lossy Autoencoder," https://arxiv.org/abs/1611.02731v1, Nov. 2016, 13 pages.
Courville et al., "A Spike and Slab Restricted Boltzmann Machine," Proceedings of the Fourteenth International Conference on Artificial Intelligence and Statistics, 2011, 233-241.
Denton et al., "Semi-Supervised Learning with Context-Conditional Generative Adversarial Networks, " https://arxiv.org/abs/1611.06430, Nov. 2016, 10 pages.
Dinh et al., "Density estimation using Real NVP," https://arxiv.org/abs/1605.08803v1, May 2016, 29 pages.
Engel et al., "Neural Audio Synthesis of Musical Notes with WaveNet Autoencoders," https://arxiv.org/abs/1704.01279, Apr. 2017, 16 pages.
Eslami et al., "Attend, Infer, Repeat: Fast Scene Understanding with Generative Models," https://arxiv.org/abs/1603.08575v3, last revised Aug. 2016, 17 pages.
Finn et al., "Unsupervised Learning for Physical Interaction through Video Prediction," https://arxiv.org/abs/1605.07157v4, Oct. 2016, 12 pages.
Goodfellow et al., "Generative Adversarial Nets," Advances in Neural Information Processing Systems, retrieved from URL <http://www.cs.cmu.edu/~jeanoh/16-785/papers/goodfellow-nips2014-gans.pdf>, 2014, 9 pages.
Gregor et al., "Deep AutoRegressive Networks," https://arxiv.org/abs/1310.8499v1, Oct. 2013, 9 pages.
Gregor et al., "Towards conceptual compression," Proceedings of the 30th International Conference on Neural Information Processing Systems, Dec. 2016, 9 pages.
Gulrajani et al., "PixelVAE: A Latent Variable Model for Natural Images," https://arxiv.org/abs/1611.05013, Nov. 2016, 9 pages.
Hinton et al., "Reducing the Dimensionality of Data with Neural Networks," Science, retrieved from URL <https://www.cs.toronto.edu/~hinton/science.pdf>, Jul. 2006, 313(5786):504-507.
Hoffman et al., "Efficient Learning of Domain-invariant Image Representations," https://arxiv.org/abs/1301.3224v1, Jan. 2013, 9 pages.
Isola et al., "Image-to-Image Translation with Conditional Adversarial Networks," https://arxiv.org/abs/1611.07004v1, Nov. 2016, 16 pages.
Jang et al., "Categorical Reparameterization with Gumbel-Softmax," https://arxiv.org/abs/1611.01144v1, Nov. 2016, 13 pages.
Kalchbrenner et al., "Video Pixel Networks," https://arxiv.org/abs/1610.00527, Oct. 2016, 16 pages.
Kingma et al., "Adam: A Method for Stochastic Optimization," https://arxiv.org/abs/1412.6980v1, Dec. 2014, 9 pages.
Kingma et al., "Auto-Encoding Variational Bayes," https://arxiv.org/abs/1312.6114v1, Dec. 2013, 9 pages.
Kingma et al., "Improved Variational Inference with Inverse Autoregressive Flow," Proceedings of the 30th International Conference on Neural Information Processing Systems, Dec. 2016, 9 pages.
Ledig et al., "Photo-Realistic Single Image Super-Resolution Using a Generative Adversarial Network," https://arxiv.org/abs/1609.04802v1, Sep. 2016, 14 pages.
Maddison et al., "The Concrete Distribution: A Continuous Relaxation of Discrete Random Variables," https://arxiv.org/abs/1611.00712v1, Nov. 2016, 17 pages.
Mehri et al., "SampleRNN: An Unconditional End-to-End Neural Audio Generation Model," https://arxiv.org/abs/1612.07837v1, Dec. 2016, 11 pages.
Mnih et al., "Neural Variational Inference and Learning in Belief Networks," https://arxiv.org/abs/1402.0030v1, Jan. 2014, 10 pages.
Mnih et al., "Variational inference for Monte Carlo objectives," https://arxiv.org/abs/1602.06725v1, Feb. 2016, 11 pages.
Panayotov et al., "Librispeech: An ASR corpus based on public domain audio books," 2015 IEEE International Conference on Acoustics, Speech and Signal Processing (ICASSP), Apr. 2015, 5 pages.
PCT International Preliminary Report on Patentability in International Appln. No. PCT/EP2018/065308, dated Dec. 19, 2019, 13 pages.
PCT International Search Report and Written Opinion in International Appln. No. PCT/EP2018/065308, dated Sep. 20, 2018, 19 pages.
Rezende et al., "Variational Inference with Normalizing Flows," https://arxiv.org/abs/1505.05770v1, May 2015, 10 pages.
Rezende et al., "Stochastic Backpropagation and Approximate Inference in Deep Generative Models," https://arxiv.org/abs/1401.4082v3, May 2014, 14 pages.
Salakhutdinov et al., "Deep Boltzmann Machines," Proceedings of the 12th International Conference on Artificial Intelligence and Statistics (AISTATS), 2009, 8 pages.
Santoro et al, "One-shot Learning with Memory-Augmented Neural Networks," https://arxiv.org/abs/1605.06065, May 2016, 13 pages.
Theis et al., "Lossy Image Compression with Compressive Autoencoders," https://arxiv.org/abs/1703.00395, Mar. 2017, 19 pages.
van de Oord et al., "Conditional Image Generation with PixelCNN Decoders," https://arxiv.org/abs/1606.05328v1, Jun. 2016, 13 pages.
van den Oord et al., "Pixel Recurrent Neural Networks," https://arxiv.org/abs/1601.06759v1, Jan. 2016, 10 pages.
van den Oord et al., "WaveNet: A Generative Model for Raw Audio," https://arxiv.org/abs/1609.03499v1, Sep. 2016, 15 pages.
Vincent et al., "Stacked Denoising Autoencoders: Learning Useful Representations in a Deep Network with a Local Denoising Criterion," Journal of Machine Learning Research, Dec. 2010, 3371-3408.
Vinyals et al., "Show and Tell: A Neural Image Caption Generator," IEEE Conference on Computer Vision and Pattern Recognition (CVPR), Jun. 2015, 3156-3164.
Yang et al., "Improved Variational Autoencoders for Text Modeling using Dilated Convolutions," https://arxiv.org/abs/1702.08139v1, Feb. 2017, 12 pages.

* cited by examiner

GENERATING DISCRETE LATENT REPRESENTATIONS OF INPUT DATA ITEMS

CROSS-REFERENCE TO RELATED APPLICATIONS

This application is a National Stage Application under 35 U.S.C. § 371 and claims the benefit of International Application No. PCT/EP2018/065308, filed on Jun. 11, 2018, which claims priority to U.S. Provisional Application Ser. No. 62/517,824, filed on Jun. 9, 2017. The disclosure of the prior application is considered part of and is incorporated by reference in the disclosure of this application.

BACKGROUND

This specification relates to processing data items through the layers of neural networks to generate outputs.

Neural networks are machine learning models that employ one or more layers of nonlinear units to predict an output for a received input. Some neural networks include one or more hidden layers in addition to an output layer. The output of each hidden layer is used as input to the next layer in the network, i.e., the next hidden layer or the output layer. Each layer of the network generates an output from a received input in accordance with current values of a respective set of parameters.

Variational autoencoders can autoencode input data items, i.e., generate output data items that are reconstructions of input data items provided to the autoencoder. Variational autoencoders typically include an encoder neural network and a decoder neural network. Generally, the encoder neural network and the decoder neural network in a given variational autoencoder are trained jointly to generate reconstructions of input data items.

SUMMARY

This specification describes a system implemented as one or more computer programs on one or more computers in one or more locations that generates discrete latent representations of input data items, e.g., images, audio data, videos, electronic documents, and so on. Generally, each discrete latent representation identifies a respective value for each of one or more latent variables, where the number of latent variables is fixed. The latent representation is referred to as a discrete latent representation because, unlike a continuous representation, the value for each of the latent variables is selected from a discrete set of possible values. More specifically, the value for each of the latent variables is a vector selected from a discrete set of latent embedding vectors.

The neural network system comprises a memory for storing a set of latent embedding vectors; and one or more computers and one or more storage devices storing instructions that when executed by the one or more computers cause the one or more computers to implement: an encoder neural network configured to: receive an input data item; and process the input data item to generate an encoder output that comprises, for each of one more latent variables, a respective encoded vector; and a subsystem configured to: provide the input data item as input to the encoder neural network to obtain the encoder output for the input data item; and generate a discrete latent representation of the input data item from the encoder output, comprising: for each of the latent variables, determining, from the set of latent embedding vectors in the memory, a latent embedding vector that is nearest to the encoded vector for the latent variable.

The neural network system may include one or more of the following features. The discrete latent representation of the input data item may include, for each of the latent variables, an identifier of the nearest latent embedding vector to the encoded vector for the latent variable. The input data item may be an image, and each latent variable may correspond to a distinct spatial location in a two-dimensional feature map. the encoder neural network is a deconvolutional neural network that generates the encoder output as a feature map that includes a respective encoded vector for each of the spatial locations. The input data item may be audio data, and each latent variable may correspond to a distinct position in a sequence. The encoder neural network may generate the encoder output as a sequence of encoded vectors. The encoder neural network may have a dilated convolutional architecture. The input data item may be a video, and each latent variable may correspond to distinct point in a three-dimensional feature map. The instructions may further cause the one or more computers to implement: a decoder neural network, wherein the decoder neural network is configured to: receive a decoder input derived from the discrete latent representation of the input data item, and process the decoder input to generate a reconstruction of the input data item, and wherein the subsystem is further configured to: generate the decoder input, wherein the decoder input comprises, for each of the latent variables, the latent embedding vector that is nearest to the encoded vector for the latent variable in the encoder output, and provide the decoder input as input to the decoder neural network to obtain the reconstruction of the input data item. The decoder input may further comprise context data and the decoder neural network may generate the reconstruction of the input data item based on the context data and the discrete latent representation. The input data item may be audio data, and the context data may be data characterizing a speaker in whose style the reconstruction should be generated. The speaker may be a different speaker from a speaker of the input data item. The decoder neural network may be an auto-regressive decoder neural network that is configured to autoregressively generate the reconstruction conditioned on the decoder input. The system may train a generative neural network, e.g., an auto-regressive generative neural network, to generate latent representations, e.g., either after the encoder neural network has been trained or jointly with the encoder neural network. The system can then generate new data items using the generative neural network by generating decoder inputs from latent representations generated by the trained generative neural network and using the decoder neural network to generate data items from the decoder inputs.

According to another aspect, there is provided a method of training an encoder neural network and a decoder neural network and of updating latent embedding vectors, the method comprising: receiving a training data item; processing the training data item through the encoder neural network in accordance with current values of the encoder network parameters of the encoder neural network to generate a training encoder output that comprises, for each of the one more latent variables, a respective training encoded vector; selecting, for each latent variable and from a plurality of current latent embedding vectors currently stored in the memory, a current latent embedding vector that is nearest to the training encoded vector for the latent variable; generating a training decoder input that includes the nearest current latent embedding vectors; processing the training decoder input through the decoder neural network in accordance with current values of the decoder network parameters of the decoder neural network to generate a training reconstruction of the training data item; determining a reconstruction update to the current values of the decoder network parameters and the encoder network parameters by determining a gradient with respect to the current values of the decoder network parameters and the encoder network parameters to optimize a reconstruction error between the training reconstruction and the training data item; and for each latent variable, determining an update to the nearest current latent embedding vector for the latent variable by determining a gradient with respect to the nearest current latent embedding vector to minimize an error between the training encoded vector for the latent variable and the nearest current latent embedding vector to the training encoded vector for the latent variable.

The method may further comprise: for each latent variable, determining a respective commitment update to the current values of the encoder parameters by determining a gradient with respect to the current values of the encoder parameters to minimize a commitment loss between the training encoded vector for the latent variable and the nearest current latent embedding vector to the training encoded vector for the latent variable. The commitment loss may be a constant multiplied by a square of an l2 error between the training encoded vector for the latent variable and a stop gradient of the nearest current latent embedding vector to the training encoded vector. The error between the training encoded vector for the latent variable and the nearest current latent embedding vector to the training encoded vector may be a constant multiplied by a square of an l2 error between a stop gradient of the training encoded vector for the latent variable and the nearest current latent embedding vector to the training encoded vector. Determining the gradient with respect to the current values of the encoder network parameters may comprise copying gradients from the decoder input to the encoder output without updating the current latent embedding vectors. Determining the gradient with respect to the current values of the encoder network parameters may comprise: determining a subgradient through the operation of selecting the nearest current latent embedding vector; and using the subgradient to determine the gradient with respect to the current values of the encoder network parameters.

According to a further aspect, there is provided a method of generating a new data item, the method comprising: generating a discrete latent representation using an auto-regressive generative neural network, wherein the generated discrete latent representation identifies, for each of one or more latent variables, a respective latent embedding vector from a set of latent embedding vectors; generating a decoder input that comprises, for each latent variable, the respective latent embedding vector identified for the latent variable in the discrete latent representation; and processing the decoder input using a decoder neural network to generate the new data item.

The auto-regressive generative neural network may have been trained to generate discrete latent representations for training data items that match discrete latent representations generated by a subsystem according to any of the above aspects for the training data items. The auto-regressive generative neural network may have been trained as a prior during the training of the encoder neural network.

Particular embodiments of the subject matter described in this specification can be implemented so as to realize one or more of the following advantages. The described system can generate latent representations of input data items that allow high quality reconstructions of the input data items to be generated even though the latent representations are much smaller than latent representations generated by conventional neural network-based encoders that allow reconstructions of comparable (or even lesser) quality to be generated, e.g., continuous latent variable models. In particular, because of the way that the described systems select the value for each latent variable from a discrete set of latent embedding vectors, the latent representations are discrete and can be stored using very little memory or transmitted using very little bandwidth while still allowing high quality reconstructions to be generated.

Additionally, the described systems can generate high quality representations while requiring a relatively small amount of computing resources to train and without suffering from large variance during training, thereby reducing the complexity and unpredictability of the training process. In particular, reconstructions generated by the described systems can match or exceed the quality of reconstructions generated by conventional continuous latent variable models while requiring a significantly smaller amount of computational resources, e.g., memory and/or processing resources, to train, to perform inference, or both, than the conventional continuous latent variable models. The latent representations generated by the system do not suffer from posterior collapse issues when paired with a powerful decoder, e.g., an auto-regressive decoder.

By using an auto-regressive encoder neural network to generate latent representations, the described systems can generate new data items that are coherent and high quality without consuming an excessive amount of computational resources.

The described system is particularly suitable for applications in data compression, for example, image compression, video compression, audio compression and electronic document compression.

It will be appreciated that aspects can be combined and it will be readily appreciated that features described in the context of one aspect can be combined with other aspects.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
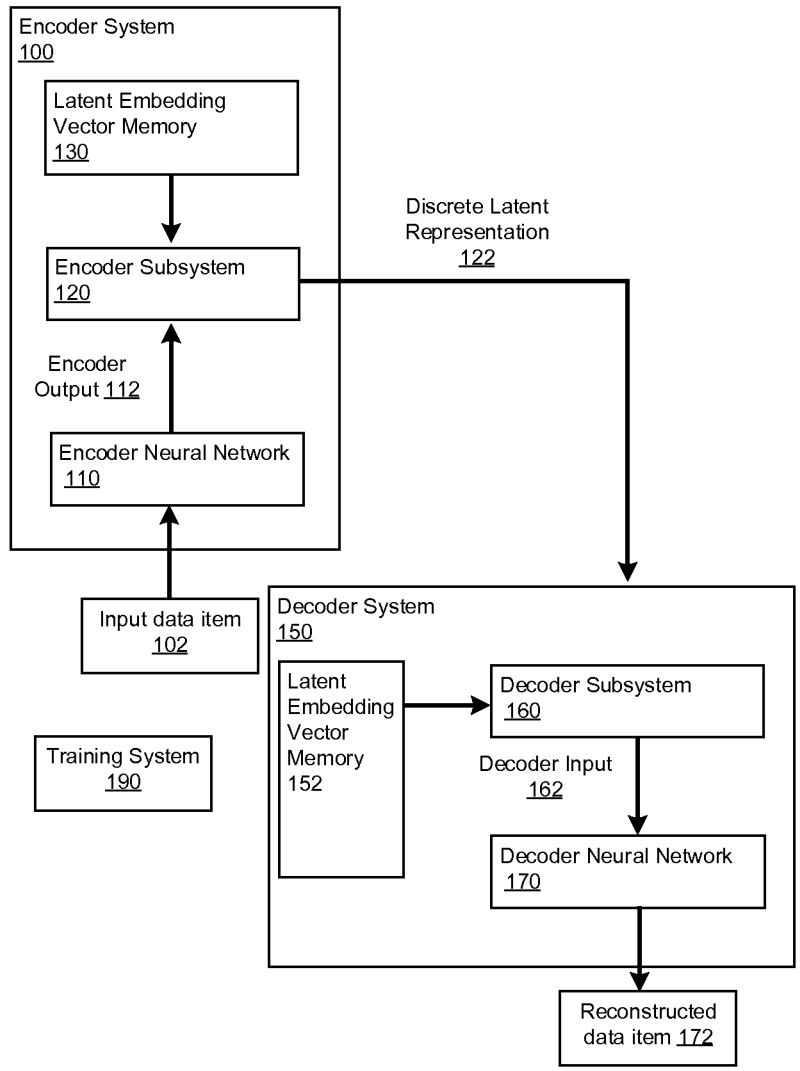
FIG. 1A shows an example encoder system and an example decoder system.

FIG. 1 shows an example encoder system 100 and an example decoder system 150. The encoder system 100 and decoder system 150 are examples of systems implemented as computer programs on one or more computers in one or more locations, in which the systems, components, and techniques described below can be implemented.

The encoder system 100 receives an input data item 102 and encodes the input data item 102 to generate a discrete latent representation 122 of the input data item 102.

As will be described in more detail below, the latent representation 122 is a numeric representation that identifies features of the input data item 102 in a latent space. More specifically, the latent representation 122 identifies, for each of a fixed number of latent variables, a respective latent embedding vector in the latent space. The latent representation 122 is a discrete representation because each latent embedding vector is selected from a discrete set of latent embedding vectors.

The decoder system 150 receives the discrete latent representation 122 of the input data item 150 (or a further compressed version of the discrete latent representation 122) and generates a reconstructed data item 172 that is a reconstruction of the input data item 102. That is, the decoder system 150 generates an estimate of the input data item 102 based on the discrete latent representation 122 of the input data item 102.

In particular, the encoder system 100 includes an encoder neural network 110, an encoder subsystem 120, and a latent embedding vector memory 130 that stores a set of latent embedding vectors.

The encoder neural network 110 is a neural network that has been configured through training to process the input data item 102 to generate an encoder output 112 for the input data item 102 in accordance with a set of parameters (referred to in this specification as "encoder network parameters").

The encoder output 112 includes a respective encoded vector for each of one or more latent variables.

In particular, when the input data item 102 is an image, each latent variable corresponds to a distinct spatial location in a two-dimensional feature map. That is, the encoder output 112 includes a respective encoded vector for each spatial location in the two-dimensional feature map, and each spatial location corresponds to a different latent variable. In these cases, the encoder neural network 110 can be a convolutional neural network that processes the image to generate the encoder output.

When the input data item 102 is audio data, e.g., a raw audio waveform, each latent variable corresponds to a distinct position in a sequence. That is, the encoder neural network 110 generates the encoder output 112 as a sequence of encoded vectors, with each position in the sequence corresponding to a different latent variable. In these cases, the encoder neural network 110 can be a dilated convolutional neural network that receives the sequence of audio data and generates the sequence of encoded vectors.

When the input data item 102 is a video, each latent variable corresponds to a distinct point in a three-dimensional feature map. That is, the encoder output 112 includes a respective encoded vector for each point in the three-dimensional feature map and each point corresponds to a different latent variable. In these cases, the encoder neural network 110 can be a convolutional neural network with layers that propagate information across time, e.g., recurrent layers or pooling layers, or a neural network that includes three-dimensional convolutional layers that receives the video as a sequence of frames and generates the three-dimensional feature map.

Unlike a system that generates continuous latent representations and instead of using the encoder output as the representation of the input data item 102, the encoder subsystem 120 generates the discrete latent representation 122 of the input data item 102 using the encoder output 112 and the latent embedding vectors in the memory 130.

In particular, for each latent variable, the encoder subsystem 120 determines, from the set of latent embedding vectors in the memory 130, a latent embedding vector that is nearest to the encoded vector for the latent variable. For example, the subsystem 120 can determine the latent embedding vector that is nearest to a given encoded vector using a nearest neighbor lookup on the set of latent embedding vectors or any other appropriate distance metric.

In some cases, the subsystem 120 considers the entire set of latent embedding vectors as possibilities for each of the latent variables, i.e., selects the latent embedding vector for each latent variable from the entire set of latent embedding vectors.

In some other cases, the set of latent embedding vectors is partitioned, with only the latent embedding vectors in the partition corresponding to a given latent variable being considered as potentially being the nearest latent embedding vector to the encoded vector for the given latent variable.

The subsystem 120 then includes, in the discrete latent representation 122, data that identifies, for each latent variable, the nearest latent embedding vector to the encoded vector for the latent variable.

Generating a discrete latent representation is described in more detail below with reference to FIGS. 1B and 2.

In some implementations, the encoder system 100 and the decoder system 150 are implemented on the same set of one or more computers, e.g., when the discrete representation is being used to reduce the storage size of the data item when stored locally by the set of one or more computers. In these implementations, the encoder system 120 stores the discrete latent representation 122 (or a further compressed version of the discrete latent representation 122) in a local memory accessible by the one or more computers so that the discrete latent representation (or the further compressed version of the discrete latent representation) can be accessed by the decoder system 150.

In some other implementations, the encoder system 100 and the decoder system 150 are remote from one another, i.e., are implemented on respective computers that are connected through a data communication network, e.g., a local area network, a wide area network, or a combination of networks. In these implementations, the discrete representation is being used to reduce the bandwidth required to transmit the input data item 102 over the data communication network. In these implementations, the encoder system 120 provides the discrete latent representation 122 (or a further compressed version of the latent representation) to the decoder system 150 over the data communication network for use in reconstructing the input data item 102.

The decoder system 150 includes a decoder subsystem 160 and a decoder neural network 170.

The decoder subsystem 160 is configured to receive the discrete latent representation 122 and generate a decoder input 162 using the latent embedding vectors in a latent embedding memory 152.

The latent embedding memory 152 generally stores the same latent embedding vectors as the latent embedding memory 130. When the encoder system 100 and decoder system 150 are implemented on the same set of computers, the memory 130 and the memory 152 can be the same memory. When the encoder system 100 and the decoder system 150 are remote from one another, the encoder system 100 can send the decoder system 150 the latent embedding vectors that are stored in the memory 130 prior to the decoder system 150 being used to reconstruct data items. That is, the set of latent variables only need to be sent from the encoder system 100 to the decoder system 150 once in order for the decoder system 150 to be able to reconstruct data items.

The decoder input 162 includes, for each latent variable, the latent embedding vector that is identified for the latent variable in the discrete latent representation 122. Because the decoder system 150 has access to the same latent embedding vectors as the encoder system 160, the discrete latent representation 122 does not need to include the latent embedding vectors themselves and instead includes identifiers for the latent embedding vectors that are known to, i.e., that can be resolved by, the decoder system 150.

The decoder neural network 170 has been trained to process the decoder input 162 to generate the reconstruction 172 of the input data item 102 in accordance with a set of parameters (referred to in this specification as "decoder network parameters"). The decoder neural network 170 can be the same type of neural network as the encoder neural network 110, but configured to generate a reconstruction from a decoder input rather than an encoder output (which is the same size as the decoder input) from an input data item (which is the same size as the reconstruction).

In some implementations, the decoder input 162 also includes context data that characterizes the desired output for the decoder neural network 170. For example, when the input data item is audio data, the context data can be data characterizing a speaker in whose style the reconstruction should be generated. After training, by making the speaker a different speaker from a speaker of the input data item, the decoder system 150 can effectively perform speaker conversion, i.e., transferring the voice from one speaker to another without changing the contents of what is said.

Generating a reconstruction of an input data item from a discrete latent representation of the data item is described in more detail below with reference to FIGS. 1B and 3.

In order for the decoder neural network to be able to generate high quality reconstructions from decoder inputs, a training system 190 trains the encoder neural network 110 and the decoder neural network 170 jointly to determine trained values of the encoder network parameters and the decoder network parameters while also adjusting the latent embedding vectors in the memory 130 (and 152) to allow the latent embedding vectors to effectively represent features of input data items. This training is described in more detail below with reference to FIG. 4.

In some implementations, after this joint training, the system 100 can employ a more powerful encoder neural network and/or the system 150 can employ a more powerful decoder neural network than the networks that were used in the training to improve the performance of the system at inference time.

In some implementations, at inference time the encoder system 100 uses an auto-regressive neural network as the encoder, e.g., a PixelCNN when the data items are images or a WaveNet when the data items are audio. Generally, an auto-regressive neural network is a neural network that generates outputs in an auto-regressive manner, i.e., generates the current output conditioned on the outputs that have already been generated.

That is, in these implementations, after training of the encoder and decoder to determine the trained values and to determine the final set of latent embedding vectors, the training system 190 fits an autoregressive encoder over the latents so that the autoregressive neural network is configured to generate values for the latent variables autoregressively. In some implementations, the system 190 can instead train this auto-regressive encoder jointly with the less-powerful encoder and the decoder, i.e., by employing it as a prior over the latents during the joint training described above and below with reference to FIG. 4.

In these implementations, the encoder system 100 and the decoder system 150 are able to generate new data items in addition to being able to reconstruct existing data items by making use of the auto-regressive neural network. In particular, the encoder system 100 can generate a discrete latent representation by using the auto-regressive neural network as a generative neural network, i.e., by using the auto-regressive neural network to generate latent representations without needing to condition the auto-regressive neural network on an existing data item. The decoder system 150 can then generate a new data item from the discrete latent representation.

For example, the systems can generate a new image or a new audio sample that are coherent and high quality.

As another example, the system can receive an existing portion of a video and generate additional frames that are coherent with the existing portion of the video and high quality. For example, the system can generate the latent representation that corresponds to the existing portion of the video using the (non-autoregressive) encoder, and then generate the remaining portion of the latent representation using the auto-regressive encoder conditioned on the existing latent representation. In some cases, the auto-regressive encoder can be conditioned on additional context information also, e.g., information that identifies an action being performed by an entity depicted in the existing portion of the video.

In some implementations, the decoder system 150 can use an auto-regressive neural network as the decoder. This setup typically causes conventional variational autoencoders to perform poorly as they suffer from "posterior collapse", i.e., the latents are ignored by the auto-regressive decoder as the decoder is powerful enough to model the distribution over possible data items accurately without relying on the input latents. However, because of the use of the latent embedding vectors as described above, the auto-regressive decoder still makes use of the discrete latent representation as generated by the encoder system 100. This can allow the systems 100 and 150 to use an even smaller number of latent variables to effectively represent a data item, i.e., because it combines the additional modeling capacity of the auto-regressive model with the information conveyed by the latent variables, further decreasing the amount of data required to be transmitted or stored to effectively represent a data item.

Figure 1B:
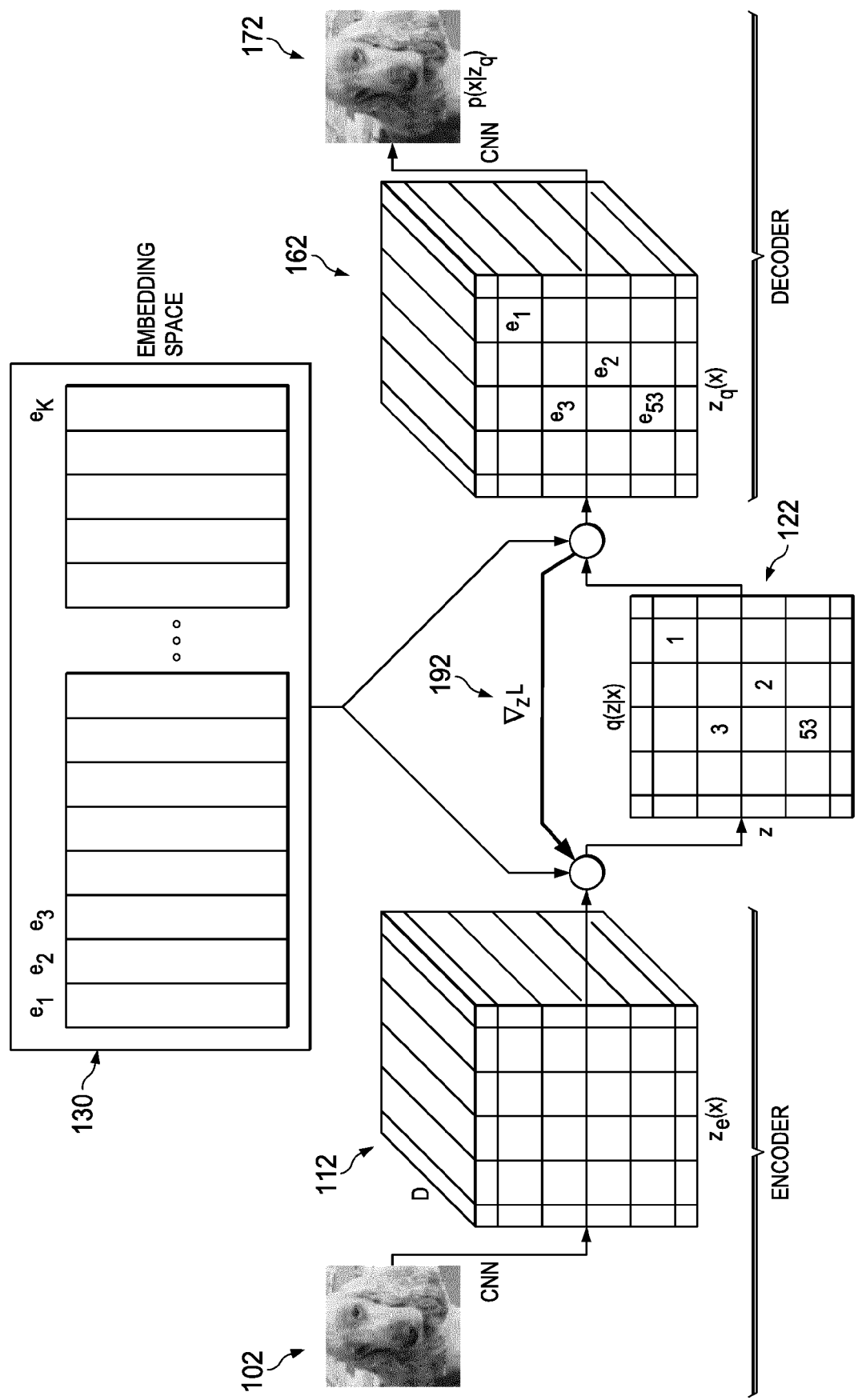
FIG. 1B illustrates an example of the operation of the encoder and decoder systems when the input data item is an image.

FIG. 1B illustrates an example of the operation of the systems 100 and 150 when the input data item 102 is an image.

In the example of FIG. 1B, the system 100 receives an input data item (image) 102 and generates as output a reconstruction 172 of the input image.

In particular, the encoder neural network 110 processes the input image to generate the encoder output 112. As can be seen in FIG. 1B, the encoder output 112 is a respective D dimensional vector for each spatial location in a two-dimensional feature map, with each spatial location corresponding to a respective latent variable. Thus, the encoder output 112 includes a respective encoded vector for each of multiple latent variables.

The system 100 then generates the discrete latent representation 122 using the encoder output 112 and the set of latent embedding vectors stored in the memory 130. In particular, in the example of FIG. 1B, the memory 130 stores K latent embedding vectors $e_1$ through $e_K$.

To generate the latent representation 122, the system 100 identifies, for each of the latent variables, the latent embedding vector of the K latent embedding vectors that is nearest to the encoded vector for the latent variable, e.g., using a nearest neighbor look-up. The system 100 then generates the latent representation 122 that identifies, for each of the latent variables, the nearest latent embedding vector to the encoded vector for the latent variable. As can be seen in the example of FIG. 1B, for the latent variable corresponding to a first spatial location, the representation 122 identifies the latent embedding vector $e_1$ while for the latent variable corresponding to a second spatial location the representation identifies the latent embedding vector $e_{53}$, and so on.

The system 150 then generates the decoder input 162 using the latent embedding vectors and the latent representation 122. In particular, the system 150 generates the decoder input 162 as a three-dimensional feature map having a D dimensional vector at each of multiple spatial locations. The D dimensional vector at any given spatial location is the latent embedding vector identified for the corresponding latent variable in the latent representation 122. Thus, the decoder input 162 includes the latent embedding vector $e_1$ at the first spatial location, the latent embedding vector $e_{53}$ at the second spatial location, and so on.

The system 150 then processes the decoder input 162 using the decoder neural network 170 to generate the reconstruction 172 of the input data item 102, i.e., an image the same size as the input image that is an estimate of the input based on the latent representation 122.

When the example of FIG. 1B depicts a reconstruction generated during training of the encoder 110 and the decoder 150, the training system 190 needs to backpropagate gradients into the encoder to update the values of the encoder network parameters. As will be described in more detail below, the training system 190 can copy gradients 192 from the decoder input to the encoder output in order to allow for the encoder network parameters to be updated.

Figure 2:
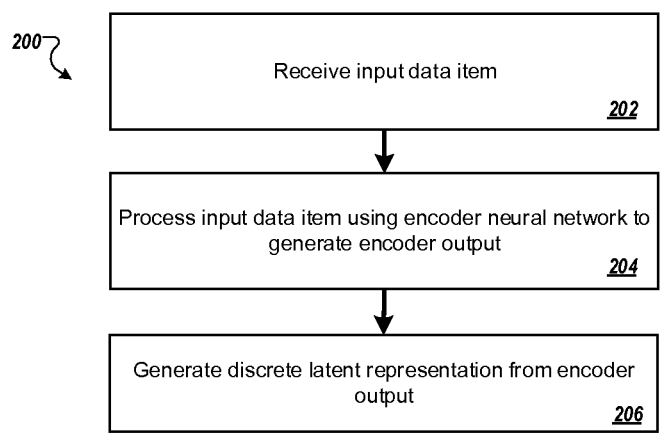
FIG. 2 is a flow diagram of an example process for generating a discrete latent representation of a data item.

FIG. 2 is a flow diagram of an example process 200 for generating a discrete latent representation of an input data item. For convenience, the process 200 will be described as being performed by a system of one or more computers located in one or more locations. For example, an encoder system, e.g., the encoder system 100 of FIG. 1, appropriately programmed, can perform the process 200.

The system receives an input data item (step 202).

The system processes the input data item using an encoder neural network to generate an encoder output for the input data item (step 204). In particular, as described above, the encoder neural network is configured to process the input data item to generate an output that includes a respective encoded vector for each of one or more latent variables.

The system generates a discrete latent representation of the input data item using the encoder output (step 206).

In particular, for each latent variable, the system selects the latent embedding vector stored in the latent embedding vector memory that is nearest to the encoded vector for the latent variable.

The system then generates a discrete latent representation that identifies, for each of the latent variables, the nearest latent embedding vector to the encoded vector for the latent variable.

The discrete latent representation can identify nearest encoded vector in any of a variety of ways. For example, the latent representation can include, for each latent variable, a one-hot encoding of the nearest latent embedding vector for the latent variable. As another example, the latent representation can be a single vector that includes, for each latent variable, an identifier for the nearest latent embedding vector for the latent variable. Generally, the discrete latent representation can use any identifier that can be resolved by the decoder system.

In some implementations, the system further compresses the discrete latent representation, e.g., using arithmetic coding or another conventional data compression technique, before storing the discrete latent representation or transmitting the discrete latent representation to a decoder system. The decoder system also maintains the set of latent embedding vectors and an instance of the decoder neural network and can then reconstruct the data item by generating a decoder input from the discrete latent representation and processing the decoder input using the decoder neural network.

Figure 3:
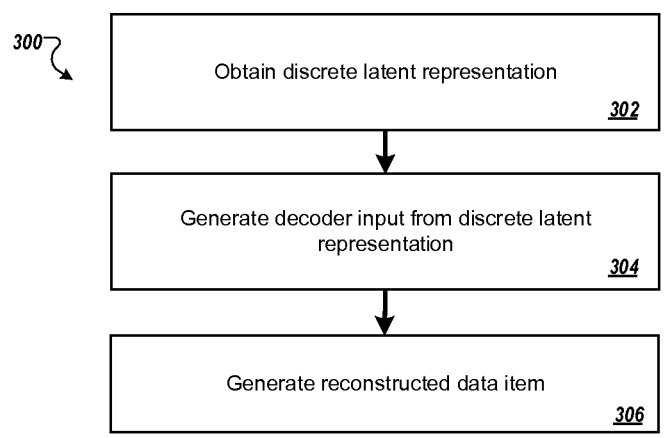
FIG. 3 is a flow diagram of an example process for generating a reconstruction of a data item from a discrete latent representation of the data item.

FIG. 3 is a flow diagram of an example process 300 for generating a reconstruction of a data item from a discrete latent representation of the data item. For convenience, the process 300 will be described as being performed by a system of one or more computers located in one or more locations. For example, a decoder system, e.g., the decoder system 150 of FIG. 1, appropriately programmed, can perform the process 300.

The system obtains the discrete latent representation of the data item (step 302). In some cases, the system directly accesses the discrete latent representation of the data item, e.g., from memory or by receiving the discrete latent representation from an encoder system over a data communication system. In other cases, the system receives a further compressed version of the discrete latent representation and decompresses, e.g., using arithmetic decoding or another conventional technique that matches the technique used to compress the latent representation, the received version to obtain the discrete latent representation.

The system generates a decoder input from the discrete latent representation using the latent embedding vectors (step 304). In particular, the system generates a decoder input that includes, for each latent variable, the latent embedding vector identified in the discrete latent representation for the latent variable.

The system generates the reconstruction of the input data item by processing the decoder input using the decoder neural network (step 306).

Figure 4:
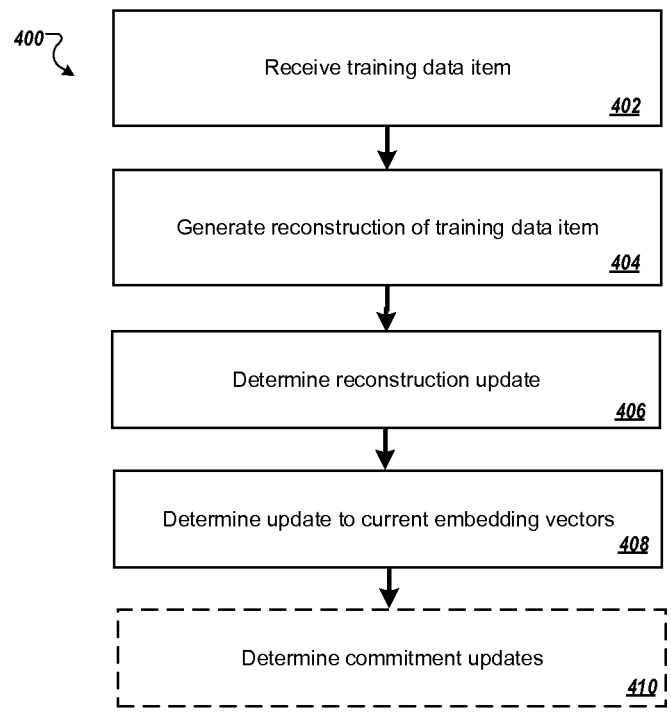
FIG. 4 is a flow diagram of an example process for determining an update to the encoder network parameters, the decoder network parameters, and the latent embedding vectors.

FIG. 4 is a flow diagram of an example process 400 for training the encoder neural network, the decoder neural network, and updating the latent embedding vectors. For convenience, the process 400 will be described as being performed by a system of one or more computers located in one or more locations. For example, a training system, e.g., the training system 190 of FIG. 1, appropriately programmed, can perform the process 400.

The system can repeatedly perform the process 400 to repeatedly update the values of the encoder network parameters, the decoder network parameters, and the latent embedding vectors.

The system receives a training data item (step 402). For example, the training data item can be a training data item randomly sampled from a set of training data maintained by the system.

The system generates a training reconstruction of the training data item using the encoder neural network in accordance with current values of the encoder network parameters, the current latent embedding vectors, i.e., the latent embedding vectors that are currently stored in the memory, and the decoder neural network in accordance with current values of the decoder network parameters (step 404).

In particular, the system processes the training data item through the encoder neural network in accordance with current values of the encoder network parameters to generate a training encoder output that includes, for each of the one more latent variables, a respective training encoded vector.

The system then selects, for each latent variable and from the current latent embedding vectors, a current latent embedding vector that is nearest to the training encoded vector for the latent variable.

The system then generates a training decoder input that includes the nearest current latent embedding vectors and processes the training decoder input through the decoder neural network in accordance with the current values of the decoder network parameters to generate the training reconstruction of the training data item.

The system determines a reconstruction update to the current values of the decoder network parameters and the encoder network parameters (step 406).

In particular, the system determines the reconstruction updates by determining a gradient with respect to the current values of the decoder network parameters and the encoder network parameters of a reconstruction error between the training reconstruction and the training data item, i.e., to optimize the reconstruction error.

In some implementations the reconstruction error is a reconstruction loss that satisfies:

$$L_r = \log p(x|z_q(x)),$$

where x is the input data item, $z_q(x)$ is the decoder input, and $p(x|z_q(x))$ is the probability assigned to the input data item by the decoder.

In order to determine the gradient of this reconstruction error with respect to the encoder network parameters, the system needs to backpropagate gradients into the encoder from the decoder. However, the operation of selecting the nearest current latent embedding vector has no defined gradient.

In some implementations, to backpropagate into the encoder neural network in spite of this, the system copies gradients from the decoder input to the encoder output without updating the current latent embedding vectors.

In some other implementations, the system determines a subgradient through the operation of selecting the nearest current latent embedding vector for each latent variable and uses the subgradient to determine the gradient with respect to the current values of the encoder network parameters.

By determining this update, the system encourages the encoder and decoder neural networks to generate higher quality reconstructions given the current latent embedding vectors, i.e., the latent embedding vectors currently stored in the memory.

The system determines updates to the current latent embedding vectors that are stored in the memory (step 408).

In particular, in some implementations, for each latent variable, the system determines an update to the nearest current latent embedding vector for the latent variable by determining a gradient with respect to the nearest current latent embedding vector of an error between the training encoded vector for the latent variable and the nearest current latent embedding vector for the latent variable, i.e., to minimize the error.

For example, the error E for a given latent variable can satisfy:

$$\|sg[z_e(x)] - e\|_2^2,$$

where sg stands for the stop gradient operator that is defined as identity at forward computation time and has zero partial derivatives, thus effectively constraining its operand to be a non-updated constant, $z_e(x)$ is the encoded vector for the latent variable, and e is the nearest current latent embedding vector for the latent variable.

Thus, the error is a constant, e.g., one or a different positive value, multiplied by the square of an l2 error between the stop gradient of the training encoded vector for the latent variable and the nearest current latent embedding vector to the training encoded vector.

In some other implementations, the system can update the current embedding vectors as a function of the moving averages of the encoded vectors in the training encoder outputs. That is, for each current embedding vector, the system can update the embedding vector using exponential moving averages of the n encoded vectors that are nearest to the current embedding vector.

For example, for a given embedding vector $e_i$, and at training time step t, the system can set the value as follows:

$$N_i^{(t)} := N_i^{(t-1)} * \gamma + n_i^{(t)}(1 - \gamma)$$

$$m_i^{(t)} := m_i^{(t-1)} * \gamma + \sum_j z_{i,j}^{(t)}(1 - \gamma)$$

$$e_i^{(t)} := \frac{m_i^{(t)}}{N_i^{(t)}},$$

where $\gamma$ is a fixed value between zero and one, $n_i^{(t)}$ is the number of nearest encoded vectors that are being used to update the value of the given embedding vector at the time step t, the sum is a sum over the $n_i^{(t)}$ nearest encoded vectors, and $z_{i,j}^{(t)}$ is the j-th nearest encoded vector to the given embedding vector at the time step t.

By updating the current latent embedding vectors in this manner, the system moves at least some of the embedding vectors in the memory towards the encoded vectors in the encoder output.

In some implementations, the system also determines, for each latent variable, a respective commitment update to the current values of the encoder network parameters (step 410). The system can determine the update for a given latent variable by determining a gradient with respect to the current values of the encoder network parameters of a commitment loss between the training encoded vector for the latent variable and the nearest current latent embedding vector for the latent variable, i.e., to minimize the commitment loss.

For example, the commitment loss for a given latent variable can satisfy:

$$\beta \|z_e(x) - sg[e]\|_2^2,$$

where $\beta$ is a positive constant that determines the weight between the commitment loss updates and the reconstruction loss updates. For example, $\beta$ can be a value between 0.1 and 2.0.

Thus, the commitment loss is a constant multiplied by a square of an l2 error between the training encoded vector for the latent variable and the stop gradient of the nearest current latent embedding vector for the latent variable.

Including the commitment loss can ensure that the encoder neural network commits to an embedding and that the volume of the encoder outputs does not grow, preventing the volume of the embedding space from growing arbitrarily because the embeddings do not train as fast as the encoder network parameters.

Once the system has performed the process 400 for each training data item in a mini-batch of training data items, the system applies the updates to the current values of the encoder network parameters and the decoder network parameters and to the current embedding vectors, e.g., in accordance with the update rule employed by the optimizer used by the system in the training, e.g., the Adam optimizer or another gradient descent-based optimizer.

The system repeats the process 400 for multiple mini-batches to determine the trained encoder and decoder network parameter values and the final set of latent embedding vectors.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

In this specification, the term "database" is used broadly to refer to any collection of data: the data does not need to be structured in any particular way, or structured at all, and it can be stored on storage devices in one or more locations. Thus, for example, the index database can include multiple collections of data, each of which may be organized and accessed differently.

Similarly, in this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TENSORFLOW® framework or other appropriate machine learning framework.

Embodiments of the subject matter described in this specification can be implemented in a computing system that includes a back end component, e.g., as a data server, or that includes a middleware component, e.g., an application server, or that includes a front end component, e.g., a client computer having a graphical user interface, a web browser, or an app through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method of training an encoder neural network and a decoder neural network and of updating a set of latent embedding vectors stored in a memory, wherein:

the encoder neural network is configured to receive an input data item and process the input data item in accordance with a set of encoder network parameters to: generate an encoder output that comprises, for each of one more latent variables, a respective encoded vector;

the decoder neural network is configured to: receive a decoder input derived from a discrete latent representation of the input data item that is generated from the encoded vectors and the set of latent embedding vectors and process the decoder input in accordance with a set of decoder network parameters to: generate a reconstruction of the input data item, and the method comprises:

receiving a training data item;

processing the training data item through the encoder neural network in accordance with current values of the encoder network parameters of the encoder neural network to generate a training encoder output that comprises, for each of the one more latent variables, a respective training encoded vector;

selecting, for each latent variable and from a plurality of current latent embedding vectors currently stored in the memory, a current latent embedding vector that is nearest to the training encoded vector for the latent variable;

generating a training decoder input that includes the nearest current latent embedding vectors;

processing the training decoder input through the decoder neural network in accordance with current values of the decoder network parameters of the decoder neural network to generate a training reconstruction of the training data item;

determining a reconstruction update to the current values of the decoder network parameters and the encoder network parameters by determining a gradient with respect to the current values of the decoder network parameters and the encoder network parameters to optimize a reconstruction error between the training reconstruction and the training data item; and for each latent variable, determining an update to the nearest current latent embedding vector for the latent variable by determining a gradient with respect to the nearest current latent embedding vector to minimize an error between the training encoded vector for the latent variable and the nearest current latent embedding vector to the training encoded vector for the latent variable.

2. The method of claim 1, further comprising:

for each latent variable, determining a respective commitment update to the current values of the encoder network parameters by determining a gradient with respect to the current values of the encoder network parameters to minimize a commitment loss between the training encoded vector for the latent variable and the nearest current latent embedding vector to the training encoded vector for the latent variable.

3. The method of claim 2, wherein the commitment loss is a constant multiplied by a square of an l2 error between the training encoded vector for the latent variable and a stop gradient of the nearest current latent embedding vector to the training encoded vector.

4. The method of claim 1, wherein the error between the training encoded vector for the latent variable and the nearest current latent embedding vector to the training encoded vector is a constant multiplied by a square of an l2 error between a stop gradient of the training encoded vector for the latent variable and the nearest current latent embedding vector to the training encoded vector.

5. The method of claim 1, wherein determining the gradient with respect to the current values of the encoder network parameters comprises:

copying gradients from the decoder input to the encoder output without updating the current latent embedding vectors.

6. The method of claim 1, wherein determining the gradient with respect to the current values of the encoder network parameters comprises:

determining a subgradient through the selecting the nearest current latent embedding vector; and using the subgradient to determine the gradient with respect to the current values of the encoder network parameters.

7. The method of claim 1, wherein the input data item is an image or a video.

8. A system comprising one or more computers and one or more storage devices storing instructions that when executed by the one or more computers cause the one or more computers to perform operations for training an encoder neural network and a decoder neural network and of updating a set of latent embedding vectors stored in a memory, wherein:

the encoder neural network is configured to receive an input data item and process the input data item in accordance with a set of encoder network parameters to: generate an encoder output that comprises, for each of one more latent variables, a respective encoded vector;

the decoder neural network is configured to: receive a decoder input derived from a discrete latent representation of the input data item that is generated from the encoded vectors and the set of latent embedding vectors and process the decoder input in accordance with a set of decoder network parameters to: generate a reconstruction of the input data item, and the operations comprise:

receiving a training data item;

processing the training data item through the encoder neural network in accordance with current values of the encoder network parameters of the encoder neural network to generate a training encoder output that comprises, for each of the one more latent variables, a respective training encoded vector;

selecting, for each latent variable and from a plurality of current latent embedding vectors currently stored in the memory, a current latent embedding vector that is nearest to the training encoded vector for the latent variable;

generating a training decoder input that includes the nearest current latent embedding vectors;

processing the training decoder input through the decoder neural network in accordance with current values of the decoder network parameters of the decoder neural network to generate a training reconstruction of the training data item;

determining a reconstruction update to the current values of the decoder network parameters and the encoder network parameters by determining a gradient with respect to the current values of the decoder network parameters and the encoder network parameters to optimize a reconstruction error between the training reconstruction and the training data item; and for each latent variable, determining an update to the nearest current latent embedding vector for the latent variable by determining a gradient with respect to the nearest current latent embedding vector to minimize an error between the training encoded vector for the latent variable and the nearest current latent embedding vector to the training encoded vector for the latent variable.

9. The system of claim 8, the operations further comprising:

for each latent variable, determining a respective commitment update to the current values of the encoder network parameters by determining a gradient with respect to the current values of the encoder network parameters to minimize a commitment loss between the training encoded vector for the latent variable and the nearest current latent embedding vector to the training encoded vector for the latent variable.

10. The system of claim 9, wherein the commitment loss is a constant multiplied by a square of an l2 error between the training encoded vector for the latent variable and a stop gradient of the nearest current latent embedding vector to the training encoded vector.

11. The system of claim 8, wherein the error between the training encoded vector for the latent variable and the nearest current latent embedding vector to the training encoded vector is a constant multiplied by a square of an l2 error between a stop gradient of the training encoded vector for the latent variable and the nearest current latent embedding vector to the training encoded vector.

12. The system of claim 8, wherein determining the gradient with respect to the current values of the encoder network parameters comprises:

copying gradients from the decoder input to the encoder output without updating the current latent embedding vectors.

13. The system of claim 8, wherein determining the gradient with respect to the current values of the encoder network parameters comprises:
  determining a subgradient through the selecting the nearest current latent embedding vector; and
  using the subgradient to determine the gradient with respect to the current values of the encoder network parameters.

14. The system of claim 8, wherein the input data item is an image or a video.

15. One or more non-transitory computer-readable storage media storing instructions that when executed by one or more computers cause the one or more computers to perform operations for training an encoder neural network and a decoder neural network and of updating a set of latent embedding vectors stored in a memory, wherein:
  the encoder neural network is configured to receive an input data item and process the input data item in accordance with a set of encoder network parameters to: generate an encoder output that comprises, for each of one more latent variables, a respective encoded vector;
  the decoder neural network is configured to: receive a decoder input derived from a discrete latent representation of the input data item that is generated from the encoded vectors and the set of latent embedding vectors and process the decoder input in accordance with a set of decoder network parameters to: generate a reconstruction of the input data item, and the operations comprise:
  receiving a training data item;
  processing the training data item through the encoder neural network in accordance with current values of the encoder network parameters of the encoder neural network to generate a training encoder output that comprises, for each of the one more latent variables, a respective training encoded vector;
  selecting, for each latent variable and from a plurality of current latent embedding vectors currently stored in the memory, a current latent embedding vector that is nearest to the training encoded vector for the latent variable;
  generating a training decoder input that includes the nearest current latent embedding vectors;
  processing the training decoder input through the decoder neural network in accordance with current values of the decoder network parameters of the decoder neural network to generate a training reconstruction of the training data item;
  determining a reconstruction update to the current values of the decoder network parameters and the encoder network parameters by determining a gradient with respect to the current values of the decoder network parameters and the encoder network parameters to optimize a reconstruction error between the training reconstruction and the training data item; and
  for each latent variable, determining an update to the nearest current latent embedding vector for the latent variable by determining a gradient with respect to the nearest current latent embedding vector to minimize an error between the training encoded vector for the latent variable and the nearest current latent embedding vector to the training encoded vector for the latent variable.

16. The computer-readable storage media of claim 15, the operations further comprising:
  for each latent variable, determining a respective commitment update to the current values of the encoder network parameters by determining a gradient with respect to the current values of the encoder network parameters to minimize a commitment loss between the training encoded vector for the latent variable and the nearest current latent embedding vector to the training encoded vector for the latent variable.

17. The computer-readable storage media of claim 16, wherein the commitment loss is a constant multiplied by a square of an l2 error between the training encoded vector for the latent variable and a stop gradient of the nearest current latent embedding vector to the training encoded vector.

18. The computer-readable storage media of claim 15, wherein the error between the training encoded vector for the latent variable and the nearest current latent embedding vector to the training encoded vector is a constant multiplied by a square of an l2 error between a stop gradient of the training encoded vector for the latent variable and the nearest current latent embedding vector to the training encoded vector.

19. The computer-readable storage media of claim 15, wherein determining the gradient with respect to the current values of the encoder network parameters comprises:
  copying gradients from the decoder input to the encoder output without updating the current latent embedding vectors.

20. The computer-readable storage media of claim 15, wherein determining the gradient with respect to the current values of the encoder network parameters comprises:
  determining a subgradient through the selecting the nearest current latent embedding vector; and
  using the subgradient to determine the gradient with respect to the current values of the encoder network parameters.

* * * * *